United States Patent [19]

Bishop et al.

[11] Patent Number: 5,093,657
[45] Date of Patent: Mar. 3, 1992

[54] DISTRIBUTION CUTOUT CONDITION SENSOR

[75] Inventors: Martin T. Bishop, Turtle Creek; David M. Milone, Monroeville, both of Pa.

[73] Assignee: ABB Power T&D Company, Blue Bell, Pa.

[21] Appl. No.: 443,698

[22] Filed: Nov. 29, 1989

[51] Int. Cl.$^5$ .............................................. G08B 21/00
[52] U.S. Cl. ..................................... 340/638; 337/168; 324/550
[58] Field of Search .............. 340/638, 639; 324/127, 324/133, 109, 550, 686, 690; 337/206, 241, 242, 265, 168

[56] References Cited

U.S. PATENT DOCUMENTS

| | | |
|---|---|---|
| 4,398,187 | 8/1983 | Fukushima et al. ............... 340/638 |
| 4,661,807 | 4/1987 | Panaro ............................... 340/638 |

FOREIGN PATENT DOCUMENTS 0782774 9/1957 United Kingdom ........... 73/DIG. 3

Primary Examiner—Jin F. Ng
Assistant Examiner—Jill Jackson
Attorney, Agent, or Firm—A. J. Rossi

[57] ABSTRACT

A fused cutout for a power distribution system, which cutout includes an insulating member (2) having two opposed ends and a recess located between the two opposed ends, a fuse (12) defining a current path and having an element for interrupting the current path when current flowing through the path exceeds a selected value, a first conductive support structure (6) connected at a first end of the insulating member (2), conductively connected to a first end of the current path and connectable to a source of electrical power (14), a second conductive support structure (8) connected at a second end of the insulating member (2), conductively connected to a second end of the current path and connectable to a consumer of electrical power (16), each conductive support structure (6,8) producing an electric field when connected to the source of electrical power, and a mounting bracket assembly (4) for supporting the fused cutout and including a conductive member (30) secured in the recess of the insulating member (2). An electric field detector including at least one conductive electrode (42) is disposed in the recess and spaced from the conductive member (30) for generating a voltage dependent at least on the intensity of the electric field originating from the second conductive support structure (8), and a monitoring circuit (70-84) is connected to the detector for monitoring the voltage generated by the detector and providing an output signal when the value of that voltage corresponds substantially to that produced when no electric field originates at the second conductive support structure (8).

8 Claims, 2 Drawing Sheets

DISTRIBUTION CUTOUT CONDITION SENSOR

BACKGROUND OF THE INVENTION

The present invention relates to a device for detecting the operating state of a fused cutout employed in electric power distribution systems.

Fused cutouts are employed in power distribution systems as protection devices which open a current path in the event of an overcurrent condition due to overload or system short circuits. Typically, such a cutout would be series connected in a power conducting phase line via which power is distributed to consumers. Cutouts may also be applied in the primary circuits of distribution transformers or capacitor banks.

At each location where cutouts are provided, one such cutout would be associated with each power conductor phase. A power network would typically employ a large number of such cutouts distributed throughout the service area. If the fused cutout operates and breaks the circuit, an associated portion of the service area would experience a power outage. This condition could not be corrected until the utility has been informed of its existence and, by visual inspection, the open fused cutout is located and the blown fuse is replaced.

SUMMARY OF THE INVENTION

It is an object of the present invention to effect automatic detection of the operative condition of a fused cutout.

Another object of the invention is to produce a cutout condition indication which can be transmitted via an electrical conductor to a monitoring location.

Another object of the invention is to provide a detecting unit offering long-term operating reliability and a high degree of resistance to weather extremes.

A further object of the invention is to transmit cutout status signals to a monitoring location via a communication system associated with a power distribution network.

DESCRIPTION OF THE PREFERRED EMBODIMENTS

Figure 1:
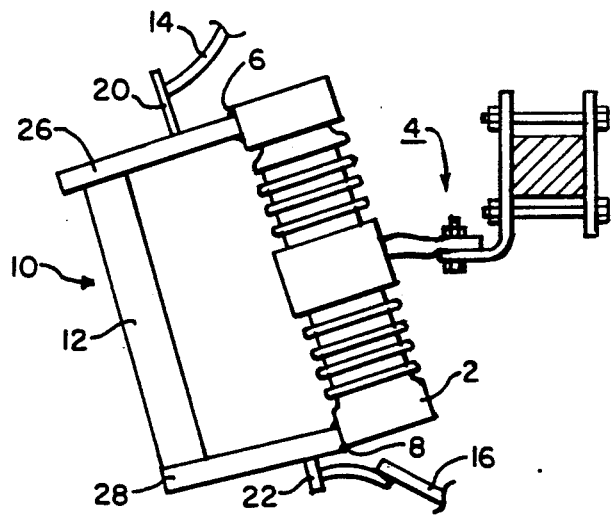
FIG. 1 is a side elevational view of a fused cutout, which has been described in detail above.

The basic components of a cutout are illustrated in FIG. 1 and include a cylindrical porcelain insulator 2 to which is secured a mounting bracket assembly 4. The cutout will be mounted, via bracket assembly 4, on, for example, the crossarm of a utility pole. Insulator 2 carries upper and lower brackets 6 and 8 which support a fuse assembly, generally indicated at 10. Assembly 10 includes a fuse holder 12 which will fall open in response to a current overload condition which melts a fuse link inside the fuse holder. Current is conducted through the fuse inside fuse holder 12 from a conductor 14 connected, for example, to a primary distribution feeder circuit, to a conductor 16 via which power is supplied to a primary lateral circuit serving one or more consumers.

Conductors 14 and 16 are conductively connected to the fused cutout assembly with internal fuse via terminals 20 and 22 and conductive structures 26 and 28 which also act to support the fuse holder 12.

The structural details of this cutout, and the specific structure of fuse holder 12 and its supporting structure will not be described in detail here because they form part of the prior art and do not represent novel features of the present invention. Thus, for example, the structure described thus far corresponds to cutouts marketed by the Westinghouse Electric Corporation under the type designations NCX and LBU II.

Figure 2:
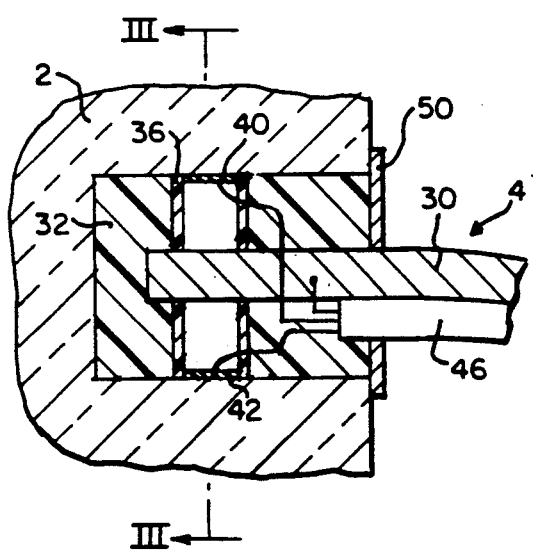
FIG. 2 is a cross-sectional elevational view taken along the line II—II of FIG. 3 and showing the details of a preferred embodiment of a detector arrangement according to the present invention.
Figure 3:
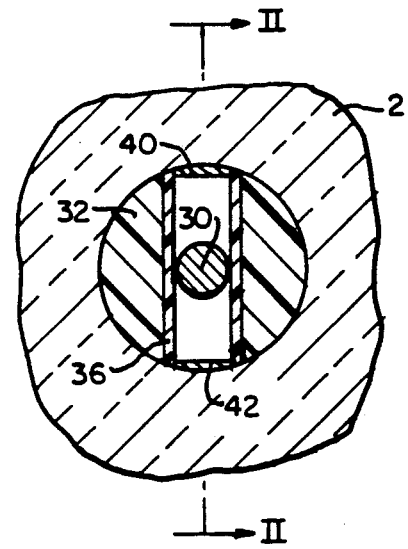
FIG. 3 is a cross-sectional view taken along the line III—III of FIG. 2.

FIGS. 2 and 3 generally indicate the region of porcelain insulator 2 at which the center lug portion of the mounting bracket assembly 4 is inserted. For this purpose, porcelain insulator 2 is conventionally provided with a cylindrical recess, the outline of which is apparent from FIG. 3, into which a cylindrical center lug 30 forming part of bracket assembly 4 is inserted and within which center lug 30 is securely held by a mass 32 of a suitable cement. One suitable cement material, which is employed in the above-identified commercially available cutouts, is known in the art as mineral lead.

According to the invention, the recess in insulator 2 is further provided with a hollow, open-ended tube 36 of a suitable plastic material, such as material sold under the trademark LEXAN, which carries two respective conductive foils 40, 42 mounted on tube 36 in diametrically opposed fashion. Each foil 40, 42 is spaced from pin 30 by a suitable distance which is determined by the geometry of the cylindrical recess and the size of the center lug assembly.

According to one exemplary embodiment of the invention, each electrode 40, 42 has an effective circular outline with a diameter of the order of 32 mm and is spaced approximately 7 mm from pin 30. Each electrode 40, 42 may be a metal foil having a thickness of the order of 0.13 mm.

A signal conducting cable 46 extends into the insulator recess and includes two signal wires each connected to a respective one of electrodes 40 and 42 and a common, or drain, wire which is connected to pin 30. The exterior of cable 46 is constituted by a conductive shield which is secured to pin 30, and the entire mounting bracket assembly 4 is connected to a ground path of the power distribution system. The wire connected to pin 30 is also in continuous contact, internally of the cable, with the cable shield.

Referring to FIG. 1 together with FIGS. 2 and 3, it will be seen that electrode 40 faces bracket 6, conductor 14 and conductive structure 26, while electrode 42 faces bracket 8, conductor 16 and conductive structure 28. Voltages will be created between each of electrodes 40 and 42 and pin 30 which are a function of the magnitudes of the electric fields existing between the electrodes and pin 30.

When fuse holder 12 with an internal fuse is closed, i.e. the cutout is operating normally, the electric fields will have substantially the same magnitude, pin 30 representing a ground point, and the voltages between each of electrodes 40 and 42 and pin 30 will correspondingly be close to one another in value.

If fuse holder 12 should open due to a melted internal fuse, so that there is no longer current flow between conductors 14 and 16, conductor 14, bracket 6 and conductive structure 26 will continue to be connected to the distribution system, so that an alternating electric field will continue to emanate from these components. However, no field will emanate from bracket 8 and structure 28.

In view of the relative positions of electrodes 40 and 42, the field which continues to originate from conductor 14, bracket 6 and conductive structure 26 will have a greater influence on the region between electrode 40 and pin 30 than on the region between electrode 42 and pin 30, so that a measurable voltage differential, with respect to pin 30, will exist between electrodes 40 and 42.

In a prototype unit having the dimensions described above, measurements revealed that when current was being conducted by the cutout, each electrode 40 and 42 was at a potential of one volt RMS with respect to pin 30, while opening of fuse 12 resulted in a voltage of 0.7 VRMS between electrode 40 and pin 30 and a voltage of 0.26 VRMS between electrode 42 and pin 30. It will be appreciated that these values could be varied by varying the area of each electrode and/or the spacing between each electrode and pin 30. The magnitude of the electrode potentials is substantially affected by the loading presented by the measurement circuit as well.

The unit shown in FIGS. 2 and 3 may be assembled as follows. First, electrodes 40 and 42 are bonded to respective ends of tube 36 and corresponding wires of cable 46 are soldered to electrodes 40 and 42. This assembly is then dipped in an epoxy, forming a protective film over the entire assembly. Then, the assembly is installed in the recess, after which the third wire of cable 46 is secured to pin 30 and pin 30 is then inserted into the recess, passing through openings formed in tube 36. Then, the recess is completely filled with the mass of mineral lead 32, which is permitted to harden. After that, a layer 50 of epoxy paint is applied to seal the recess.

The purpose of the epoxy coating which is applied to the assembly prior to insertion into the recess is to prevent the mineral lead from coming into contact with the electrodes. Such isolation is desirable because it has been found that a cement material such as mineral lead initiates a chemical reaction with materials such as copper that produces a DC offset in the potentials induced between the electrodes and pin 30.

The resulting arrangement, and particularly the disposition of electrodes 40 and 42 within the recess, results in a device having a high degree of long-term operating reliability and a high degree of resistance to weather extremes.

Figure 4:
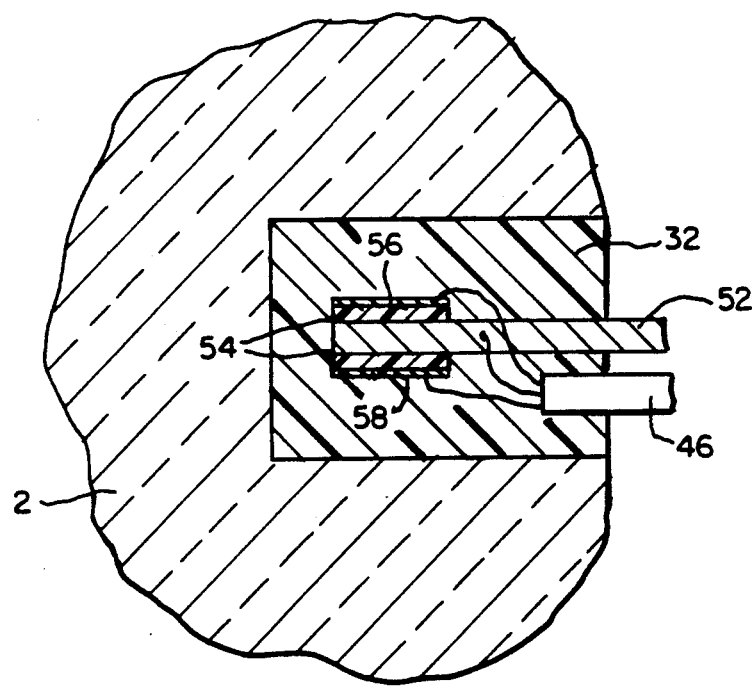
FIG. 4 is a cross-sectional view similar to that of FIG. 2 illustrating a second embodiment of a detector according to the invention.

A second possible embodiment of the present invention is illustrated in FIG. 4 where mounting pin 30 is replaced by a flat mounting plate 52. Mounted on each side of plate 52 is a respective block 54 of insulating material carrying, at its side remote from plate 52, a respective foil electrode 56, 58. Each block 54 can also be made of LEXAN. The wires of cable 46 are connected to electrodes 56 and 58 and plate 52 in the manner described above with respect to FIGS. 2 and 3. Here again, the recess is filled with a mass 32 of mineral lead as well as, if desired, a layer of epoxy paint.

In one version of the embodiment illustrated in FIG. 4, plate 52 has a thickness, in the direction between blocks 54, of the order of 6 mm and a width, perpendicular to the plane of FIG. 4, of the order of 27 mm. Each electrode 56, 58 had the form of a square measuring 25 mm on a side and each block 54 had a thickness of the order of 1.6 mm. In this arrangement, the effective area of the electrode structures was markedly greater than that of the embodiment described above with respect to FIGS. 2 and 3 and tests carried out on a prototype of the embodiment of FIG. 4 resulted in RMS voltages of 5.5 volts between electrode 56 and plate 52 and 3.5 volts between electrode and plate 52 when the cutout was operating properly, and 1.5 volts between electrode 56 and plate 52 and 0.28 volt between electrode 58 and plate 52 when the fuse had opened.

The above-noted RMS voltage differential noted in the prototype of the embodiment of FIG. 4 when the cutout was operating properly was probably due to the position of the recess in insulator 2 and/or structural or positional differences between brackets 6 and 8. It is contemplated that such a differential would be compensated, during testing prior to installation, by adjustments in the associated monitoring and comparison circuit, which will be described below.

One advantage of the embodiment shown in FIG. 4 is that all components of the detector system, including cable 46, can be secured to plate 52 before it is introduced into, and cemented in, the recess in insulator 2. Here again, before insertion into the recess, at least electrodes 56 and 58 are provided with a protective epoxy coating.

The voltages appearing between each electrode and the mounting pin, or plate, and conducted by appropriate wires of cable 46 may be monitored by any suitable monitoring and comparison circuit, constructed according to principles known in the art, which produces an output signal having a level sufficient for transmission to a monitoring location. One such processing circuit is shown, simply by way of example, in FIG. 5.

Figure 5:
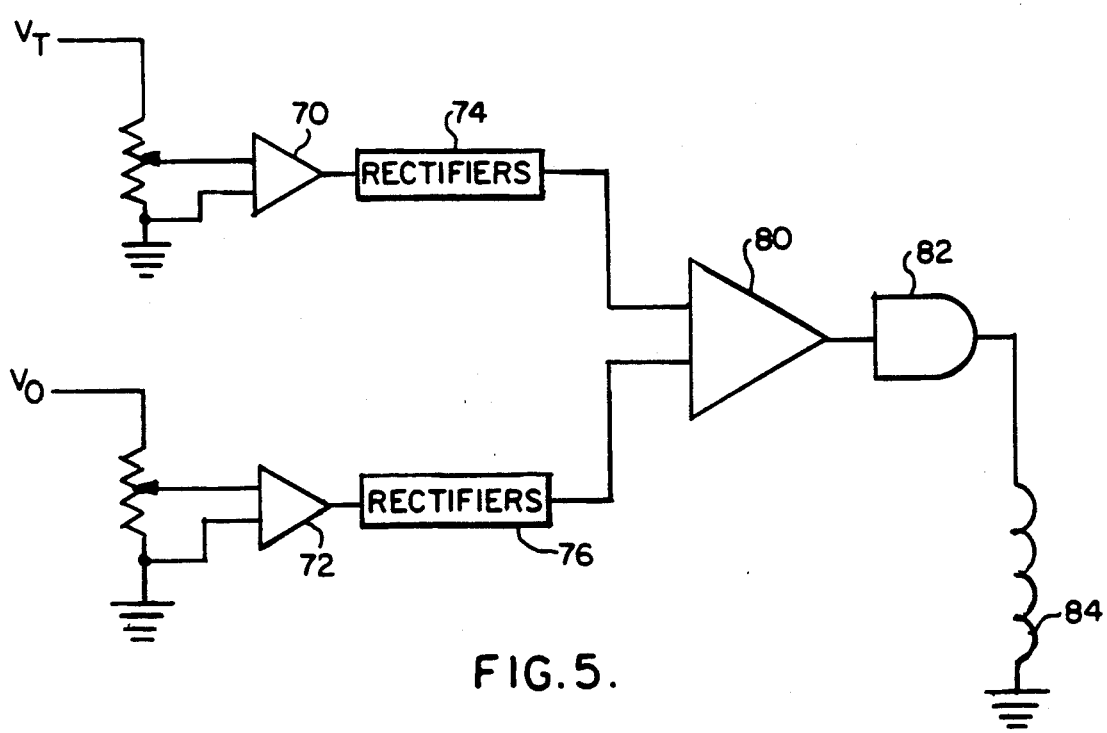
FIG. 5 is a diagram of one suitable embodiment of a condition indicating signal generating circuit forming part of a detector according to the present invention.

The circuit shown in FIG. 5 includes first and second operational amplifiers 70 and 72 each connected to the movable tap of a potentiometer whose ends are connected between one of the electrode wires and the ground wire of cable 46. In the illustrated circuit, amplifier 70 is connected to electrode 40 to receive a voltage $V_T$ and amplifier 72 is connected to electrode 42 to receive a voltage $V_B$.

The potentiometers are provided in order to enable either amplifier 70 or 72 to be adjusted so that both amplifiers produce identical output voltages when the associated cutout is in it normal operating condition, i.e., fuse holder 12 is intact. The output of each amplifier 70, 72 is supplied to a respective rectifier 74, 76, each of which may be a full wave bridge rectifier.

The resulting DC outputs from rectifiers 74 and 76 are supplied to respective inputs of a voltage amplitude comparator 80 which produces an output voltage proportional to the difference between the voltages at the outputs of rectifiers 74 and 76. The output of comparator 80 is supplied to a threshold detector 82 which is adjusted to produce an output signal having a desired level when the output from comparator 80 exceeds a selected value and has a selected polarity.

Comparator 80 may be a differential amplifier biassed to produce an output signal proportional to the difference between $V_T$ and $V_B$ and having a polarity corresponding to the polarity of this voltage difference and threshold detector 82 may be constructed to produce an output when the signal from comparator 80 exceeds a given magnitude and has either polarity. With this arrangement reversal of the connection of conductors 14 and 16, or of the wires of cable 30, will not impair proper operation of the detecting device.

The output signal produced by threshold detector 82 is supplied to the coil 84 of a relay, this output signal being of a sufficient magnitude to actuate a movable contact controlled by relay coil 84 and connected to a circuit which will produce a signal which indicates that the cutout fuse has opened. This signal can be transmitted via a suitable communication line to a central monitoring location.

Normally, the monitoring and comparison circuit of the cutout will be mounted in the vicinity of insulator 2. The movable relay contact actuated by coil 84 may be connected to a module of a power line transmission system connected to a phase of the power transmission system. Such a module, examples of which are known in the art, can store data identifying the position of the movable relay contact and this data would be transmitted via the power line to a remote monitoring location whenever the module is interrogated.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. In a fused cutout for a power distribution system, which cutout includes an insulating member having two opposed ends and a recess located between the two opposed ends, a fuse defining a current path having two ends and having an element for interrupting the current path when current flowing through the path exceeds a selected value, a first conductive support structure connected at a first end of the insulating member, conductively connected to a first end of the current path and connectable to a source of electrical power, a second conductive support structure connected at a second end of the insulating member, conductively connected to a second end of the current path and connectable to a consumer of electrical power, each conductive support structure producing an electric field when connected to the source of electrical power, and a mounting bracket assembly for supporting the fused cutout and including a conductive member secured in the recess of the insulating member, the improvement comprising:

electric field detector means including electrode means disposed in said recess and spaced from said conductive member for generating a voltage dependent at least on the intensity of the electric field originating from said second conductive support structure; and a monitoring circuit connected to said detector means for monitoring the voltage generated by said detector means and providing an output signal when the value of that voltage corresponds substantially to that produced when an electric field originates at said first conductive support structure and no electric field originates at said second conductive support structure.

2. An arrangement as defined in claim 1 wherein said electrode means comprise one electrode positioned between said conductive member and said second conductive support structure, and a second conductive electrode disposed in said recess, spaced from said conductive member and positioned between said conductive member and said first conductive support structure for generating a voltage dependent at least on the intensity of the electric field originating from said first conductive support structure, and said monitoring circuit is further connected to receive the voltage generated by said second electrode for providing the output signal when a given difference exists between the voltages generated by said one electrode and said second electrode.

3. An arrangement as defined in claim 2 further comprising a mass of cement filling said recess for isolating said electrodes from environmental influences.

4. An arrangement as defined in claim 3 further comprising a coating layer covering said electrodes for forming a barrier between said electrodes and said mass of cement, said coating layer being of a material which is chemically inert with respect to said electrodes and said mass of cement.

5. An arrangement as defined in claim 2 wherein said conductive member is a flat plate, and further comprising two plastic blocks each mounted on a respective opposite side of said plate and each carrying a respective one of said electrodes.

6. An arrangement as defined in claim 5 wherein each said electrode is constituted by a conductive foil.

7. An arrangement as defined in claim 2 further comprising a plastic tube disposed in said recess, said tube having two opposed ends each carrying a respective one of said electrodes.

8. An arrangement as defined in claim 7 wherein each said electrode is constituted by a conductive foil.

* * * * *